(12) United States Patent
Wertz et al.

(10) Patent No.: US 7,553,178 B1
(45) Date of Patent: Jun. 30, 2009

(54) SOCKET CONNECTOR WITH PRE-ASSEMBLED SCREW

(75) Inventors: Darrell Wertz, Chandler, AZ (US); David Gregory Howell, Gilbert, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/215,580

(22) Filed: Jun. 27, 2008

(51) Int. Cl.
*H01R 13/62* (2006.01)

(52) U.S. Cl. .................. 439/331; 411/999; 411/353

(58) Field of Classification Search .................. 439/331, 439/342, 73; 411/999, 353, 107
See application file for complete search history.

(56) References Cited

U.S. PATENT DOCUMENTS

| | | | |
|---|---|---|---|
| 6,679,666 B2 * | 1/2004 | Mizuno et al. .............. | 411/353 |
| 6,769,851 B2 * | 8/2004 | Agha et al. .................. | 411/353 |
| 7,073,997 B2 * | 7/2006 | Kovac ......................... | 411/353 |
| 7,160,130 B2 * | 1/2007 | Ma ............................. | 439/331 |

* cited by examiner

*Primary Examiner*—Tho D Ta
(74) *Attorney, Agent, or Firm*—Wei Te Chung

(57) ABSTRACT

A socket connector for electrically connecting an IC package and a printed circuit board, includes a housing receiving a number of contacts, a stiffener surrounding the housing, a cover pivotably mounted at an end of the stiffener to cover the housing and a lever pivotably mounted at an opposed end of the stiffener to retain the cover to the stiffener, a number of washers mounting to the stiffener and a number of screws for mounting the stiffener to the printed circuit board. The washer has a pinhole and a number of teeth upwardly extending along a circle circumference of the pinhole. The screw is hold to the washer by the teeth of the washer before the screw engaged with the printed circuit board.

8 Claims, 4 Drawing Sheets

SOCKET CONNECTOR WITH PRE-ASSEMBLED SCREW

BACKGROUND OF THE INVENTION

1. Field of the Invention

The present invention relates to a socket connector which is used for connecting an electronic package, such as a central processing unit (CPU), with a circuit substrate, such as a printed circuit board (PCB).

2. Description of the Prior Art

Socket connectors are adapted for electrically connecting an IC package and a PCB (printed circuit board). A conventional socket connector comprises a housing with a plurality of contacts received therein, a fastening equipment for fastening the housing and a plurality of screws. The fastening equipment is formed with a stiffener surrounding the housing, a clip rotatably mounted to an end of the stiffener to cover the housing and a lever rotatably mounted to an opposed end of the stiffener to keep the clip to the stiffener. The stiffener defines a plurality of mounting holes at corners thereof, and the screws insert into the mounting holes of the stiffener from a top side and further engages with the PCB to fasten the stiffener to the PCB. However, the screw is retained only when the stiffener together with the socket connector need to be mounted to the PCB by the screw. So, before assembling the socket connector to the PCB, the screw is a separate accessory and is easily loose by an operator.

Accordingly, a new socket connector that solves the above problems is desirable.

SUMMARY OF THE INVENTION

Accordingly, an object of the present invention is to provide a socket connector with pre-assembled screw.

To fulfill the above object, a socket connector for electrically connecting an IC package and a printed circuit board, comprises a housing defining a plurality of slots for contacts; a stiffener coupled with the housing and defining a window in a central portion thereof for receiving the housing and a plurality of mounting holes; a plurality of washers located in the mounting holes of the stiffener, and each washer defining a pinhole and having a plurality of teeth upwardly extending along a circle circumference of the pinhole; and a plurality of screws. Each screw inserts into the pinhole of the washer and is held by the teeth of the washer to the washer before the screw engaging with the printed circuit board.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Figure 1:
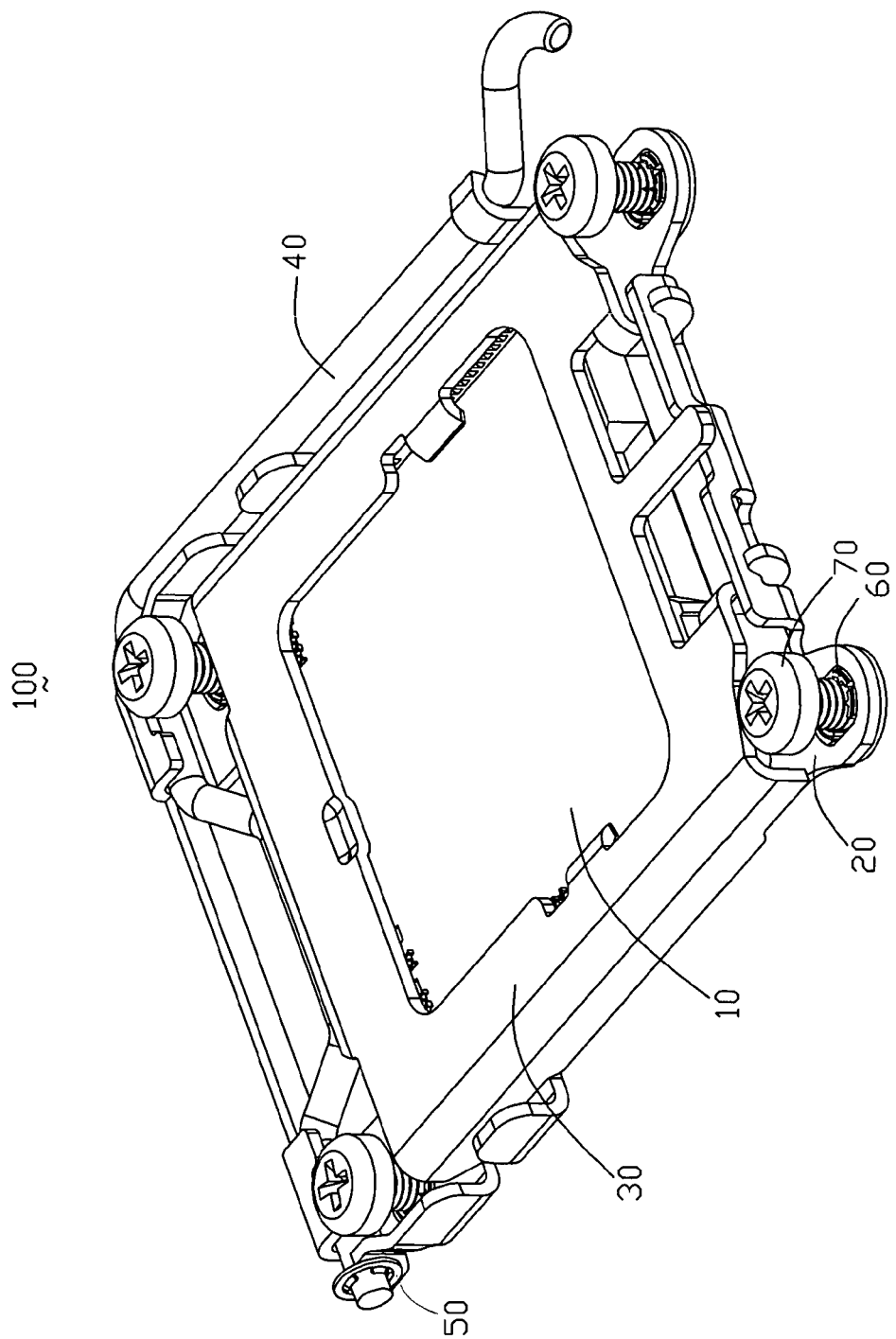
FIG. 1 is an assembled, perspective view of a socket connector in accordance with the present invention.

Reference is now made to the drawings to describe the invention in detail.

Reference will now be made to the drawing figures to describe the present invention in detail. Referring to FIGS. 1-4, a socket connector 100 in accordance with the preferred embodiment of the present invention is adapted for electrically connecting an IC package (not shown) and a PCB (not shown). The socket connector 100 comprises a housing 10 receiving a plurality of contacts (not shown), a stiffener 20 surrounding the housing 10, a clip 30 and a lever 40 respectively rotatably mounting to two opposed ends of the stiffener 20, a ring 50 assembled to the lever 40, a plurality of washers 60 mounted on the stiffener 20 and a plurality of screws 70 engaging with the washers 60.

Figure 2:
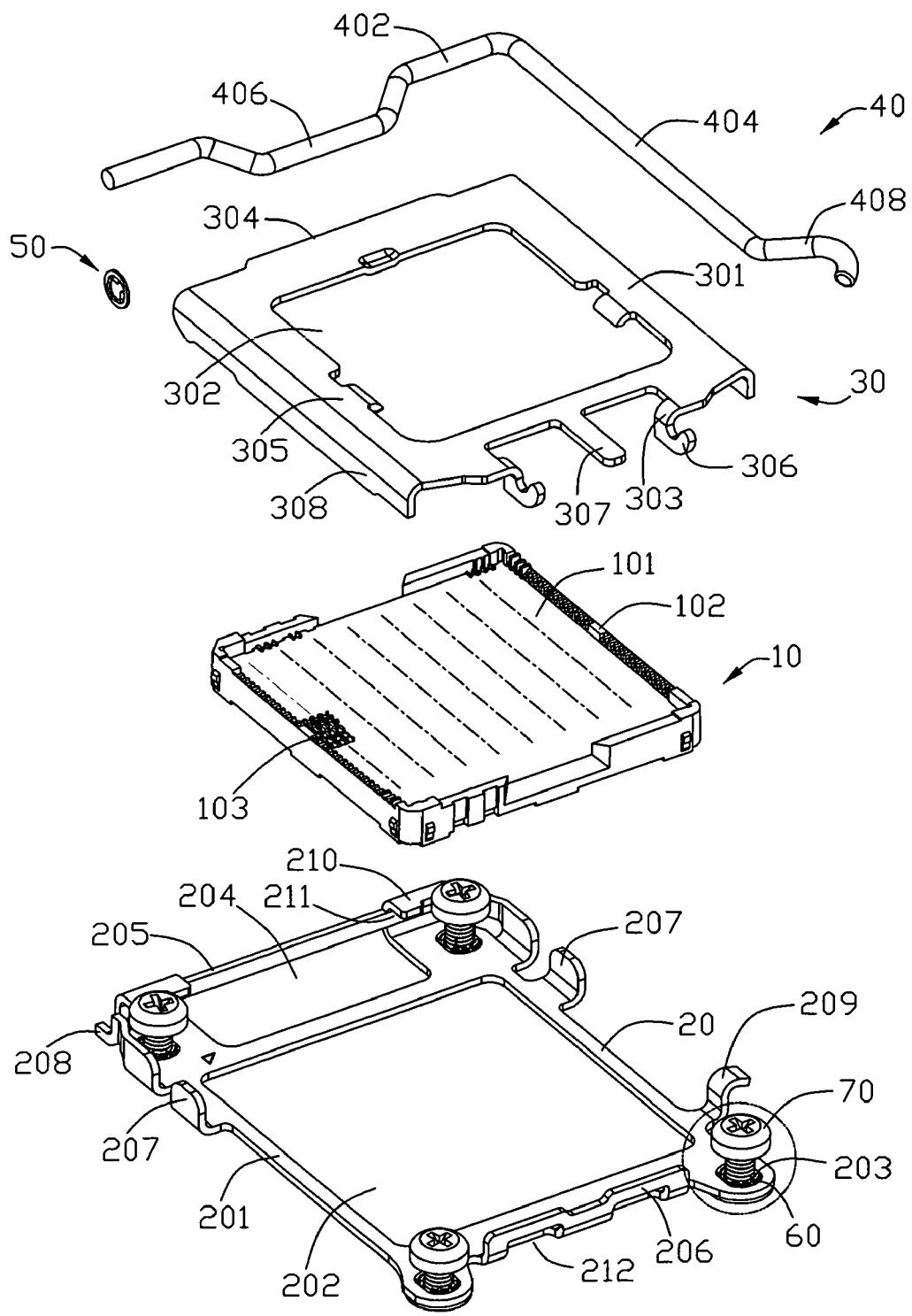
FIG. 2 is a partially exploded, perspective view of the socket connector in accordance with the present invention.

Referring to FIG. 2, the housing 10 is of a rectangular configuration and comprises a conductive region 101, a plurality of periphery walls 102 surrounding the conductive region 101, and a plurality of slots 103 defined in the conductive region 101 for receiving the contacts (not shown).

The stiffener 20 comprises a primary portion 201 and a rectangular first window 202 defined in a center of the primary portion 201 for receiving the housing 10. The primary portion 201 defines a plurality of mounting holes 203 at four corner thereof and an opening 204 defined at a front part thereof, and comprises a front wall 205 and a rear wall 206 respectively upstanding from a front and a rear edges thereof and a pair of opposed side edges (not labeled) connecting the front wall 205 and the rear wall 206. Each side edge (not labeled) has a pair of blocking portion 207 upstanding from a front part thereof, and a supporting portion 208 extending forwardly from a front end thereof. One of the side edges (not labeled) has a latch 209 extending outwardly from a rear part thereof. The front wall 205 has a pair of substantially L-shaped engaging portions 210, each defining an engaging slot 211. The rear wall 206 has a pair of engaging holes 212.

The clip 30 comprises a base plate 301 with a second window 302 in a center thereof, a pivotal portion 303 at a rear end thereof, a tongue portion 304 at a front end thereof and opposite to the pivotal portion 303, and a pair of side portions 305. The pivotal portion 303 has a pair of hooks 306 projecting rearward and a tail portion 307 rearward extending and being located between the pair of hooks 306. Each side portion 305 has a side wall 308 extending downwardly therefrom.

The lever 40 comprises a shaft 402 and an actuator 404 perpendicular to the shaft 402 to thereby form the lever 40 as a L-shape. The shaft 402 has an U-shaped bending portion 406 bending inwardly from a middle portion thereof. The actuator 404 is provided with a handle 408 at a free end thereof.

Figure 3:
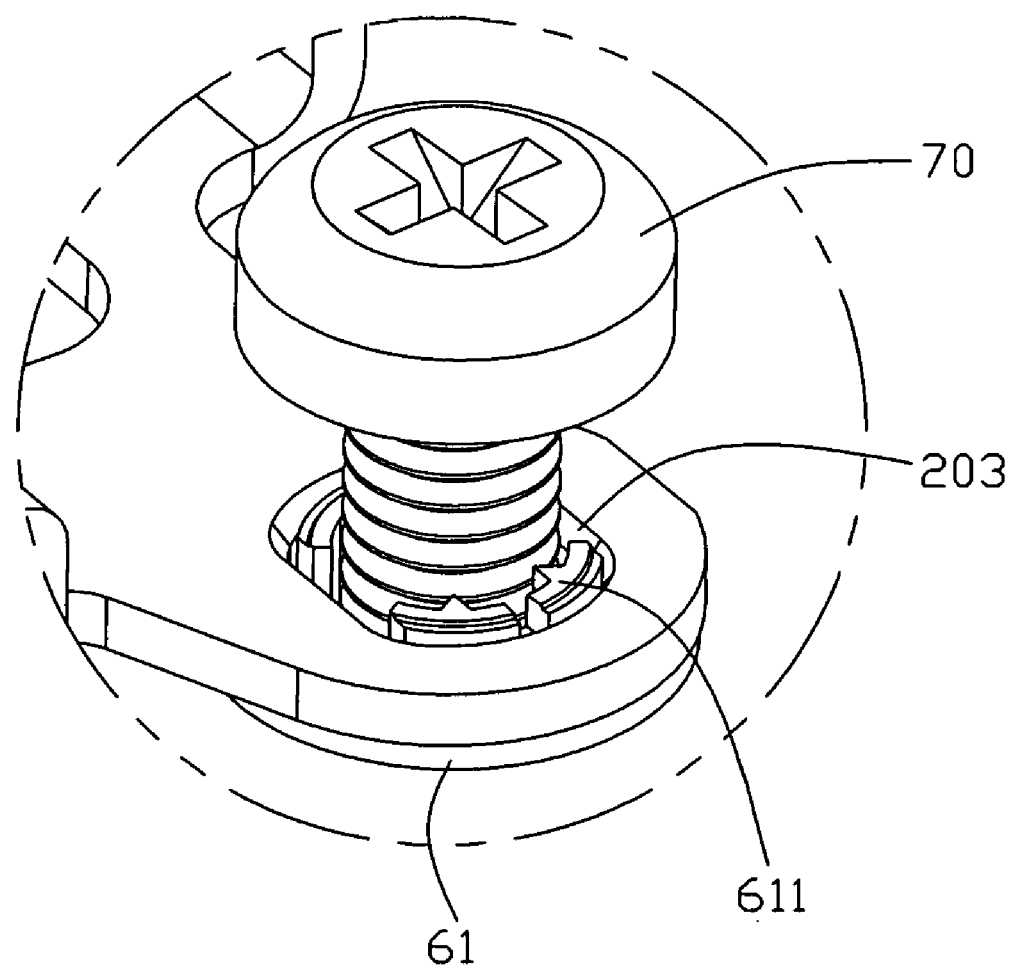
FIG. 3 is a partially enlarged view of the socket connector in FIG. 2, showing a screw engaging with a washer.
Figure 4:
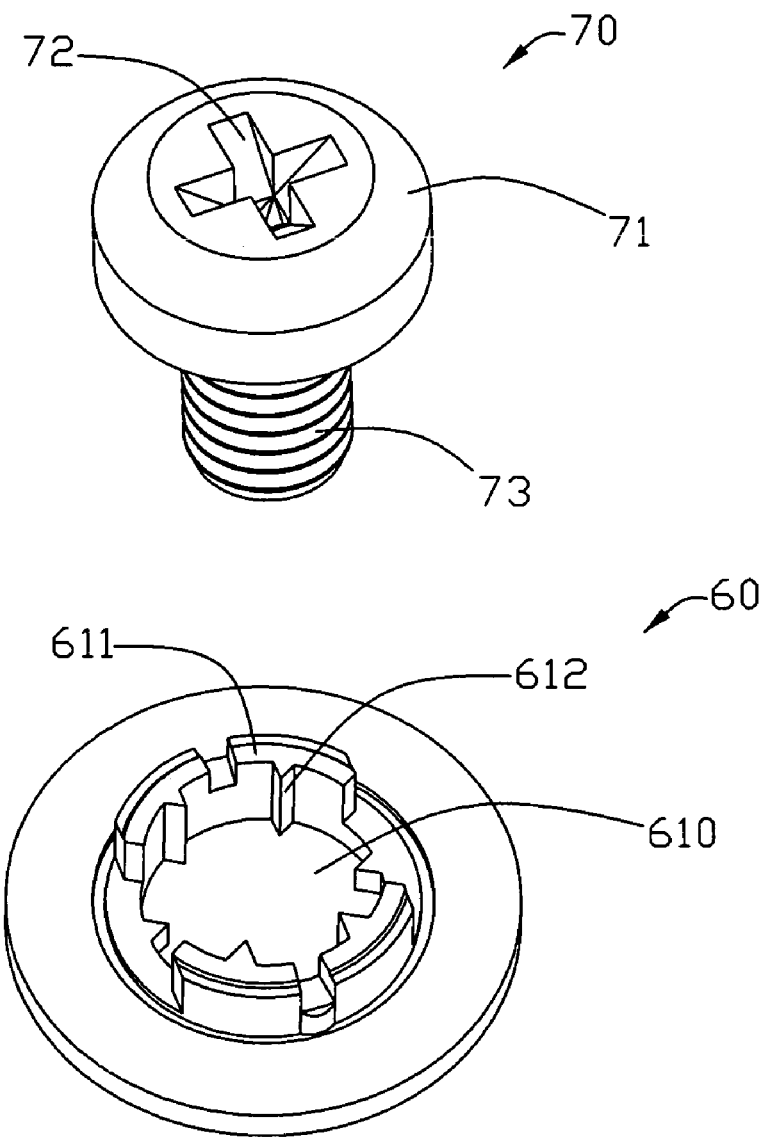
FIG. 4 is a perspective view of the screw and the washer.

Referring to FIGS. 2-4, each washer 60 comprises a circular base portion 61 with a pinhole 610 in a center thereof, and has a plurality of teeth 611 symmetrically and upwardly extending from the base portion 61 along a circle circumference of the pinhole 610. That means the washer 60 is punched by leaving out some teeth 611 along the pinhole 610. And each teeth 611 has a plurality of crush ribs 612 inwardly extending from a center part of an inner surface thereof and protruding into the pinhole 610. The screw 70 has a header portion 71 with an operating hole 72 on a top surface thereof and a breechblock 73 with screw threads.

Referring to FIGS. 2-4, different from conventional socket connector, the screw 70 is pre-assembled to the stiffener 20 by the washer 60. Firstly, put the washer 60 to the mounting hole 203 of the stiffener 20 from a bottom side with the teeth 611 located in the mounting hole 203, the teeth 611 are inwardly crushed by an inner sidewall of the mounting hole 203 during this process, so the teeth 611 can hold the washer 60 on the stiffener 20 by outwardly elastic force thereof forcing on the inner sidewall of the mounting hole 203. Then mount the screw 70 to the washer 60, the breechblock 73 is received in the pinhole 610 of the washer 60, and the crush ribs 612 around the pinhole 610 abut against the breechblock 73 to hold and position the screw 70 to the washer 60.

Referring to FIGS. 1-2, the plurality of contacts (not shown) are pre-loaded within the housing 10. The housing 10 together with the contacts (not shown) is mounted within the first window 202 of the stiffener 20. The clip 30 and the lever 40 are respectively assembled to the rear wall 206 and the front wall 205 of the stiffener 20. The ring 50 is assembled to a free end of the shaft 402 of the lever 40 and resists against one supporting portion 208. Finally, torque the screw 70 toward the stiffener 20 to mount the socket connector 100 on the PCB (not shown). During this process, the crush ribs 612 always crush the breechblock 73 of the screw 70 and can take up any misalignment.

In another alternative embodiment, the stiffener of the socket connector may not be a frame-shape, and may adapt some separated metal pieces (not shown). The metal piece (not shown) are mounted to four engaging holes (not shown) on four corners of the housing 10, the clip 30 and the lever 40 may pivotally assemble to corresponding configure (not shown) of the metal piece (not shown). Each metal piece (not shown) defines a through hole (not shown) similar with the mounting hole 203 of the stiffener 20 in the first embodiment. And the screw 70 also can be pre-assembled to the metal piece (not shown) by the washer 60, and retain the housing 10 to the printed circuit board.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector for electrically connecting an IC package and a printed circuit board, comprising:
    a housing defining a plurality of slots for contacts; a stiffener coupled with the housing and defining a plurality of mounting holes thereof;
    a plurality of washers located in the mounting holes of the stiffener, and each washer defining a pinhole and having a plurality of teeth upwardly extending along a circle circumference of the pinhole; and
    a plurality of screws for mounting the stiffener to the printed circuit board, each screw inserting into the pinhole of the washer and be held by the teeth of the washer to the washer before the screw engages with the printed circuit board;
    wherein the teeth have a plurality of crush ribs protruding into the pinhole from inner surfaces thereof to hold the screw in the pinhole of the washer.

2. The socket connector of claim 1, wherein the stiffener is formed with a plurality of separated metal pieces, the metal piece are mounted to on four corners of the housing, the mounting hole is a through hole defined on each metal piece.

3. The socket connector of claim 1, wherein the stiffener defining a window in a central portion thereof for receiving the housing and a plurality of mounting holes.

4. The socket connector of claim 3, further comprising a cover pivotably mounted at a rear portion of the stiffener for covering the housing.

5. The socket connector of claim 4, further comprising a lever pivotably mounted at a front portion of the stiffener for retaining the cover to the stiffener.

6. The socket connector of claim 5, wherein the stiffener defines a pair of engaging holes, the cover is provided with a pair of hooks pivotably engaging with the engaging holes and the cover is thereby rotatable between an open position and a closed position.

7. The socket connector of claim 6, wherein the cover has a tail portion disposed between the pair of hooks for preventing an excessive rotation of the cover.

8. A socket connector for electrically connecting an IC package and a printed circuit board, comprising:
    a housing defining a plurality of slots for contacts;
    a stiffener engaging with the housing and defining a plurality of mounting holes thereof; a plurality of washers inserting into the mounting holes of the stiffener, each washer having a pinhole in a center thereof and a plurality of crush ribs around the pinhole; and
    a plurality of screws for mounting the stiffener to the printed circuit board, each screw inserting into the pinhole of the washer and being hold by the crush ribs to the washer;
    wherein the washers has a plurality of teeth upwardly extending along a circle circumference of the pinhole, the crush ribs protruding into the pinhole from inner surfaces of the teeth to hold and position the screw in the pinhole of the washer.

\* \* \* \* \*